(12) United States Patent
Mikhailov et al.

(10) Patent No.: US 7,376,168 B2
(45) Date of Patent: May 20, 2008

(54) SEMICONDUCTOR LASER DEVICE

(75) Inventors: Aleksei Mikhailov, Dortmund (DE); Wieland Hill, Dortmund (DE)

(73) Assignee: Hentze-Lissotschenko Patentverwaltungs GmbH & Co. KG, Gerstengrund (DE)

( * ) Notice: Subject to any disclaimer, the term of this patent is extended or adjusted under 35 U.S.C. 154(b) by 310 days.

(21) Appl. No.: 10/526,276

(22) PCT Filed: Jul. 30, 2003

(86) PCT No.: PCT/EP03/08410

§ 371 (c)(1),
(2), (4) Date: Sep. 14, 2005

(87) PCT Pub. No.: WO2004/021524

PCT Pub. Date: Mar. 11, 2004

(65) Prior Publication Data

US 2006/0140242 A1   Jun. 29, 2006

(30) Foreign Application Priority Data

Sep. 2, 2002   (DE) ............................... 102 40 949
Oct. 25, 2002   (DE) ............................... 102 50 046

(51) Int. Cl.
  *H01S 3/08* (2006.01)
(52) U.S. Cl. ........................... 372/99; 372/92; 372/102
(58) Field of Classification Search .................. 372/92, 372/99, 102
  See application file for complete search history.

(56) References Cited

U.S. PATENT DOCUMENTS 3,825,856 A * 7/1974 Pezot ......................... 372/101
4,797,894 A * 1/1989 Yaeli ............................. 372/92
5,050,179 A * 9/1991 Mooradian ............... 372/44.01
5,773,345 A   6/1998 Ota
5,894,492 A * 4/1999 Welch et al. ............... 372/50.1
6,049,558 A * 4/2000 Harada et al. .............. 372/107
6,163,558 A * 12/2000 Hiiro ........................... 372/99
6,212,216 B1  4/2001 Pillai
6,301,274 B1  10/2001 Tayebati et al.
6,804,278 B2 * 10/2004 Daiber et al. ............. 372/38.01

(Continued)

FOREIGN PATENT DOCUMENTS

DE   100 43 896 A1   4/2001

(Continued)

*Primary Examiner*—Minsun Oh Harvey
*Assistant Examiner*—Yuanda Zhang
(74) *Attorney, Agent, or Firm*—Hoffman Wasson & Gitler PC

(57) ABSTRACT

The invention relates to a semiconductor laser device, including a semiconductor laser element, or a number of individual lasers mounted parallel to each other, with a number of output surfaces, from which laser light can escape, having a treater divergence in a first direction (Y) than in a second direction parallel to the above and at least one reflecting means, at a distance from the output surfaces, outside the semiconductor laser element or the individual laser, with at least one reflective surface which reflects at least a part of the laser light escaping from the semiconductor laser element or the individual lasers through the output surfaces back into the semiconductor laser element or the individual lasers, such that the mode spectrum of the semiconductor laser element or the individual lasers is influenced. The at least one reflective surface of the reflecting means has a concave curve.

23 Claims, 2 Drawing Sheets

U.S. PATENT DOCUMENTS 7,016,393 B2 * 3/2006 Anikitchev et al. ......... 372/101

FOREIGN PATENT DOCUMENTS

| DE | 100 14 181 A1 | 10/2001 |
| JP | 2001-332810 | 11/2001 |
| WO | WO 98/15994 | 4/1998 |
| WO | WO 01/95445 | 12/2001 |
| WO | WO 00/10234 | 2/2002 |
| WO | WO 02/082593 | 10/2002 |

* cited by examiner

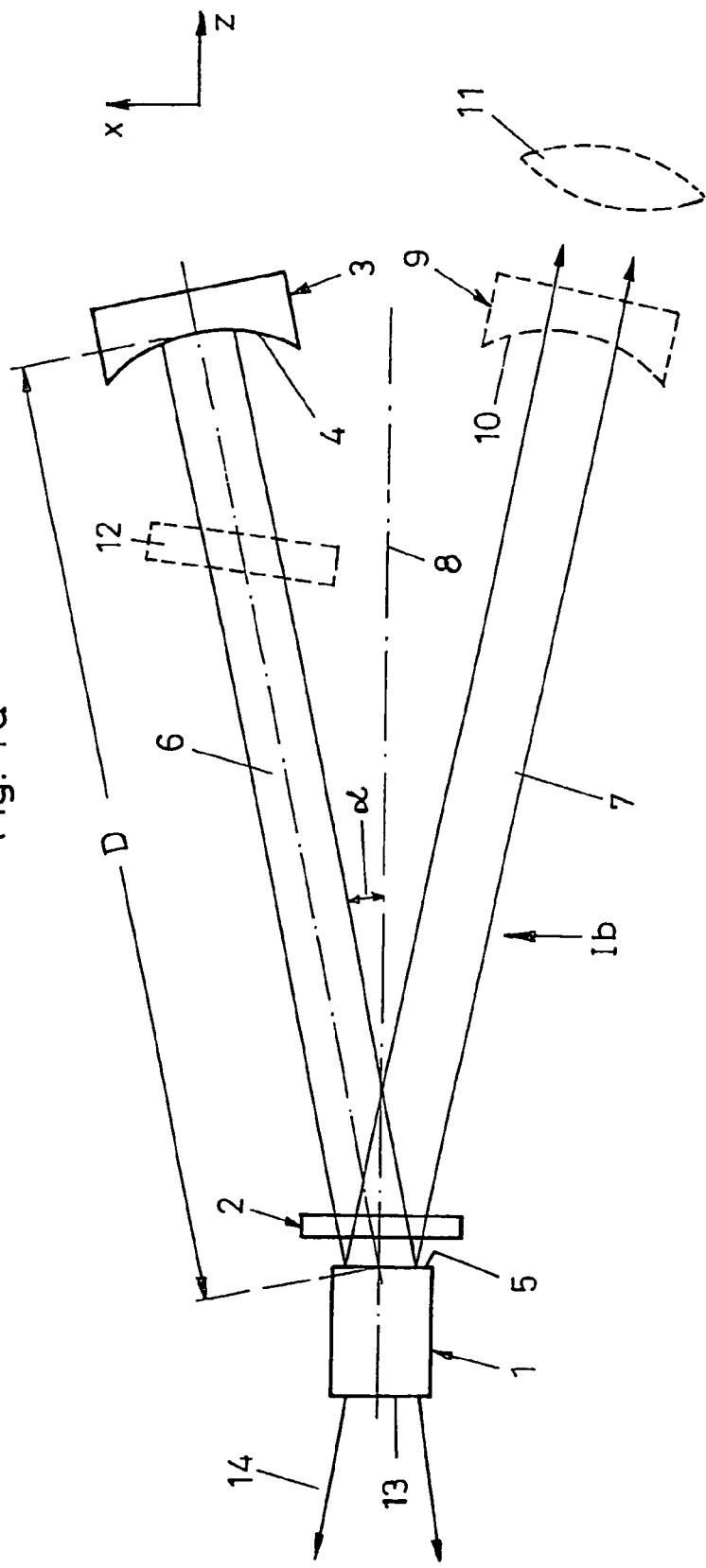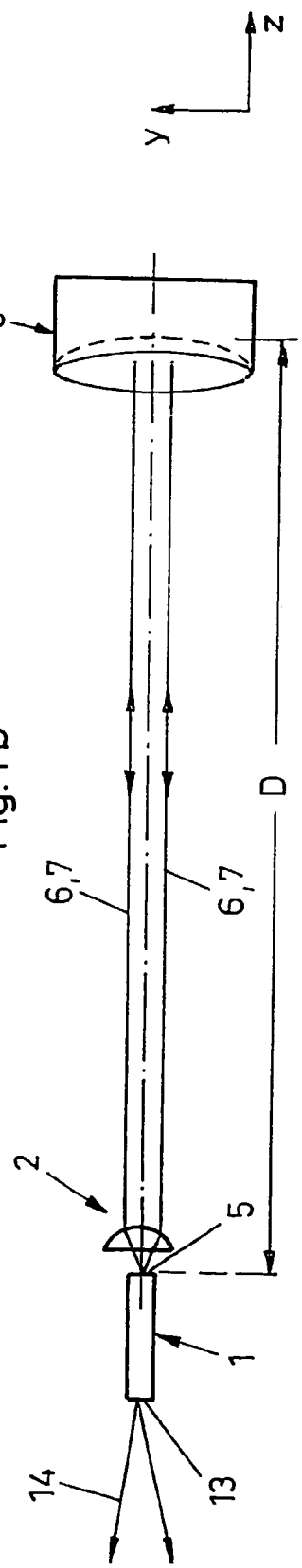

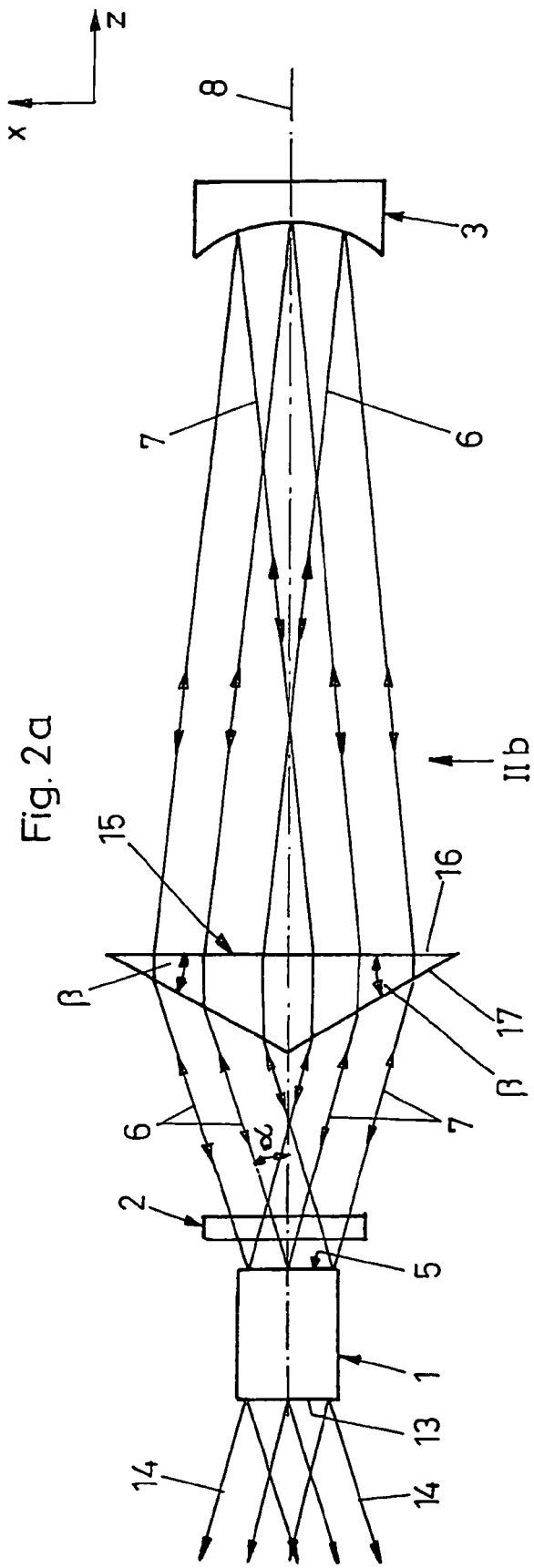
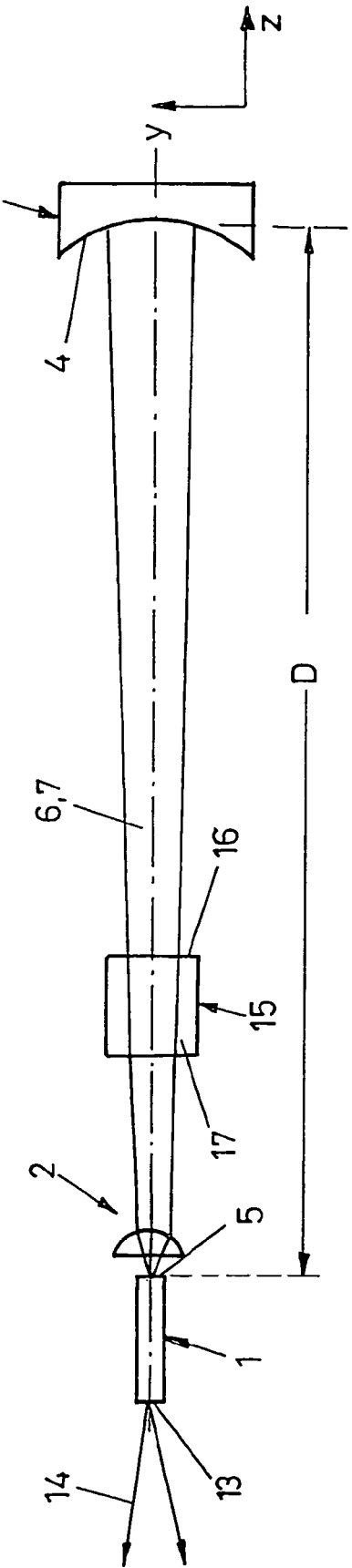
Fig. 2a
Fig. 2b

SEMICONDUCTOR LASER DEVICE

BACKGROUND OF THE INVENTION

This invention relates to a semiconductor laser device, a semiconductor laser element with at least one exit surface from which laser light can emerge, which in a first direction has greater divergence than in the second direction which is perpendicular to it, at least one reflection means which is located spaced apart from the exit surface outside of the semiconductor laser element, with a reflecting surface which can reflect back at least parts of the light which has emerged from the semiconductor laser element through the exit surface into the semiconductor laser element, such that the mode spectrum of the semiconductor laser element is influenced thereby, and a lens means which is located between the reflection means and the semiconductor laser element and which can at least partially reduce the divergence of the laser light at least in the first direction.

A semiconductor laser device of the aforementioned type is known from OPTICS LETTERS, 2002, Vol. 27, No. 3, page 167 to 169. In the semiconductor laser device described in it, a laser diode which is made as a so-called broad strip emitter is used as a semiconductor laser element. In these broad strip emitters, for example, there are exit surfaces for the laser light which have a width of roughly 100 microns and a height of roughly 1 micron. Over this width, within the internal resonator which is formed by the end surfaces of the laser diode, an entire series of different transverse modes of the laser light can be formed. At the same time, an entire series of longitudinal modes, i.e. different wavelengths of laser light, can also occur. In particular, the numerous different transverse modes adversely affect the beam quality of the laser beam emerging from this broad strip emitter. This laser radiation cannot be optimally focused. The longitudinal modes lead to spectral broadening which is not desirable for various applications.

In the aforementioned publication, an external resonator is proposed which has a highly reflecting planar mirror. Between the planar mirror and the exit surface of the semiconductor laser element, facing the external resonator on the one hand, there is a fast axis collimation lens and on the other hand, between the fast axis collimation lens and the planar mirror, there is a spherical convex lens. The fast axis collimation lens is used to collimate the light of the broad strip emitter which is much more dramatically divergent in the first direction. The spherical lens is used to focus the light which has been reflected back by the planar mirror such that it is imaged essentially back onto the exit surface. Furthermore, in the external resonator there is an aperture diaphragm. Both the aperture diaphragm and also the planar mirror are located outside the optical axis of the external resonator and outside of the normal or middle perpendicular on the exit surface. It is shown that for broad strip emitters the stronger modes generally emerge at a small angle to the normal on the exit surface from the latter. Through the aperture diaphragm which is positioned outside of the axis thus only portions of such a mode which emerges from the exit surface at an angle will be incident on the mirror and will be reflected by it through the aperture diaphragm and the spherical lens back onto the exit surface. Only light from one or more such modes is thus reflected back through the exit surface into the laser diode. In this way the laser diode can be caused to stimulate oscillations essentially on this mode so that the mode spectrum of the semiconductor laser element is reduced essentially to the transverse mode.

The laser light is decoupled from the external resonator, according to the aforementioned publication, by the component beams of the corresponding transverse mode which emerge from the exit surface at the oppositely identical angle being able to emerge from the semiconductor laser device past the aperture diaphragm and the planar mirror.

The disadvantage in the aforementioned arrangement is that there are a comparatively large number of different optical elements in the external resonator. Besides the fast axis collimation lens, they are the spherical lens, the aperture diaphragm, and the planar end mirror. Due to the many different optical elements which are provided in the external resonator, on the one hand imaging errors occur increasingly and on the other hand, large losses arise since these elements are located within the laser resonator. But in this way the attainable output power of such a semiconductor laser device is greatly limited. At the same time the output powers which can be achieved with such a semiconductor laser device can only be attained with high cost. In addition such a semiconductor laser device can only be calibrated with difficulty.

According to the existing art, an attempt is made to influence the mode spectrum of the semiconductor laser elements by structuring the active zone of the semiconductor laser element. This structuring can include changes of the refractive index in different directions, so that propagation of individual preferred transverse laser modes is preferred by these refractive indices which change in different directions. Furthermore it is possible, for example, by different degrees of doping, to act on the number of electron-hole pairs available for recombination so that at different locations of the active zone different amplifications of the laser light are possible. The two aforementioned methods for giving preference to individual transverse modes are associated with consideration production cost and likewise do not yield actually satisfactory beam quality or output power of the semiconductor laser device.

It is an object of this invention to devise a semiconductor laser which ensures comparatively high beam quality and high output power with simple means.

This is achieved as claimed in the invention by the features according to claims 1 or 6.

SUMMARY OF THE INVENTION

There is provided that the reflecting surface of the reflection means is concavely curved. In this way, compared to the above described art, an additional spherical lens within the external resonator can be omitted because the concavely curved reflecting surface can be used at the same time as an imaging element. Furthermore, the aforementioned complex structuring of the active zone of the semiconductor laser element can be omitted so that the semiconductor laser element can be comparatively unstructured.

The reflecting surface can be spherically curved. In this regard, the lens means which can be used essentially as a fast axis collimation lens can be made such that the divergence of the light emerging from the exit surface and passing through the lens means is essentially the same both in the first direction and also in a second direction perpendicular to it for individual transverse modes. In this case, the reflecting surface in the first direction and in the second direction which is perpendicular to it can have a curvature of essentially the same size.

Alternatively, the reflecting surface in the first direction and in the second direction perpendicular to it can have curvatures of different magnitude. In this case, the lens means, which is used as the fast axis collimation lens, should be made such that after emerging from the exit surface and passing through the lens means the divergence in the first and second direction is different such that the curvatures of different magnitude together with the curvatures of different magnitude of the reflecting surface interact in the two directions which are perpendicular to one another such that comparatively optimum back reflection of the desired component beams onto the exit surface is ensured.

According to one preferred embodiment of this invention, the optical distance between the reflecting surface and the exit surface of the semiconductor laser element is essentially equal to the focal length of the reflecting surface with respect to at least one of the directions. In this way, a confocal arrangement of the reflecting surface with respect to the exit surface is achieved. Here the diameter of the component beams which belong to the individual transverse modes in the plane of the exit surface have a minimum (beam waist), by which the selection of certain modes can be promoted.

There is provided that the exit surface of the semiconductor laser element facing the reflection means has a width of more than 200 microns and the reflecting surface is not curved or is curved only insignificantly. Advantageously, the exit surface has a width of more than 500 microns, especially more than 1 mm. Such very wide emitters on the one hand produce very high powers, on the other hand the divergence in the slow axis direction, i.e. in the direction in which the emitters extend over 1 mm, being very small, especially being small in almost a diffraction-limited manner. For this reason it can be sufficient in emitters of such widths for the reflecting surface to have an only insignificant curvature or no curvature at all, because the low additional losses due to the residual divergence which has remained in the slow axis direction are comparatively negligible. A planar reflecting surface can be produced more easily and can be calibrated more easily.

Advantageously, the reflecting surface or at least one of the reflecting surfaces could be made as a wavelength-sensitive element, especially as a grating. By making the reflecting surface as a planar surface a grating for wavelength selection can be easily integrated into this surface. In this way an additional wavelength-selective element can be omitted.

Furthermore, the optical distance and/or the curvature of the reflecting surface are chosen such that the beam diameter of the component beams of the light which has been reflected back to the semiconductor laser element, which component beams belong to individual transverse modes, into the plane of the exit surface corresponds essentially to the aperture which is formed by the exit surface. In this way the additional aperture diaphragm within the external resonator which is known from the art can be omitted. Finally, the topology, alignment, and distance of the reflecting surface are chosen such that a Fourier image of the emission of the exit surface is produced in the plane of the exit surface itself. The choice of a certain transverse mode can be achieved here by the reflecting surface being located at a small angle outside of the axis, i.e. outside of the normal or middle perpendicular on the exit surface. But it is also possible to select modes which propagate along the normal with a reflecting surface which is aligned perpendicular to the normal. Furthermore, in doing so the surface can be turned such that the component beams which correspond to a certain transverse mode and which emerge at the desired angle from the exit surface are reflected back exactly onto the exit surface. By the corresponding choice of the position and alignment of the reflecting surface thus the desired transverse mode can be chosen which is then preferably reflected back into the semiconductor laser element. In this way, using simple means the result is that the semiconductor laser device delivers laser light which has essentially only one transverse mode or few transverse modes.

In this embodiment, it is especially advantageous if the beam waist is of a similar size to the exit surface because then on the one hand low losses occur and on the other, high feedback over the entire width of the emitter or the entire width of the exit surface is enabled. The high feedback over the entire width of the exit surface and thus over the entire width of the laser diode is important for uniform excitation of the preferred mode in a part of the volume of the laser diode as large as possible, which volume contributes to laser emission.

Due to the fact that generally the extension of the exit surface in the slow axis is greater than in the fast axis, providing the semiconductor laser device with a lens means and a reflection means is quite effective. In particular, a lens means which is used as the fast axis collimation lens and which has a very short focal length and a reflection means with a comparatively very long focal length should be used. This is due to the fact, among others, that for reflection means with short focal lengths under certain circumstances an overly small beam waist in the slow axis direction would result on the exit surface. By defocusing or changing the distance of the reflection means a larger beam waist could be achieved, but for reflection means with a short focal length very many modes would be coupled back into the semiconductor laser element, since the distance of the individual modes in the Fourier plane is very small at a very short focal length. Therefore a reflecting surface of the reflection means with a long focal length should be used.

It is possible for the semiconductor laser element to be made as a broad strip emitter. But it is likewise possible for the semiconductor laser element to be made as a bar or stack of broad strip emitters.

Preferably, it is provided that the exit surface of the semiconductor laser element facing the reflecting surface is coated for antireflection, and this coating for antireflection can be accomplished especially by a suitable coating. This coating for antireflection amplifies the feedback from the external resonator into the semiconductor laser element and greatly reduces the feedback of the internal resonator. In this way the effect of the external modulator on the mode spectrum increases.

According to one preferred embodiment of this invention, the semiconductor laser device has two reflection means with two reflecting surfaces, the two reflecting surfaces each being tilted at oppositely equal angles to the normal on the exit surface.

Here the two reflecting surfaces of the two reflection means can have the same optical distance to the exit surface of the semiconductor laser element. In this way component beams which correspond to one transverse mode and which emerge at oppositely identical angles to the normal on the exit surface from the latter can each be reflected for itself by the two reflection means back onto the exit surface so that the effectiveness with which light is coupled into the internal resonator by the external resonator is increased.

According to one embodiment of this invention, it is possible to make at least one of the reflecting surfaces of the reflection means as a partially reflecting surface so that at least one reflection means which is provided with the partially reflecting surface is used as a decoupler. Alternatively the two reflecting surfaces of the reflection means can be made highly reflecting, the exit surface of the semiconductor laser element facing away from the reflecting surfaces being made partially reflecting and being used as a decoupler in this way.

According to one alternative preferred embodiment of this invention, between the semiconductor laser element and the reflection means there is a deflection means which can deflect onto the reflection means the component beams which are emerging at an angle to the normal on the exit surface from the latter. The deflection means can be made especially such that the component beams which are emerging at oppositely identical angles to the normal on the exit surface from the latter are incident at the same locations on the reflecting surface of the reflection means so that they are transferred into one another and can be reflected back onto the exit surface. This embodiment with additional deflection means thus saves the second reflection means.

In particular here it can be provided that the deflection means and the reflection means are located on the axis which is dictated by the middle perpendicular on the exit surface. This yields an axially symmetrical structure of the external resonator.

It is possible to make the deflection means as a prism element. Here the prism element can be arranged such that the leg surfaces are facing the exit surface of the semiconductor element. Furthermore, by the suitable choice of the angle between the hypotenuse surface and the leg surfaces of the prism element and/or by suitable selection of the distance of the deflection means from the exit surface, component beams which emerge at an angle relative to the normal on the exit surface from the latter are transferred into one another by the reflecting surface of the reflection means. In particular, different transverse modes can thus be selected by using prism elements with different angles between the hypotenuse surface and the leg surface and/or different distances between the deflection means and the exit surface.

It is possible for the reflecting surface of the reflection means for the aforementioned arrangement with a deflection means to be made partially reflecting so that the reflection means can be used as a decoupler. Alternatively, the reflecting surface of the reflection means in this arrangement can be made highly reflecting, the exit surface of the semiconductor laser element facing away from the reflecting surface being made partially reflecting and in this way being able to be used as a decoupler.

As described in the invention, it is possible for there to be between the semiconductor laser element and the reflection means a wavelength-selective element which is made especially as an etalon. The wavelength-selective element can be located between the lens means and the reflection means. This wavelength-selective element makes it possible to select certain longitudinal modes, especially one longitudinal mode so that the emitted laser light has a small spectral width.

As in the invention, it is furthermore possible for the semiconductor laser element to be exposed to a voltage and to be supplied with current for producing electron-hole pairs only in partial areas which correspond to the three-dimensional extension of the desired mode of the laser light. Giving preference to desired modes of the laser light can be further optimized by this measure which can be carried out relatively easily.

BRIEF DESCRIPTION OF THE DRAWINGS

Other features and advantages of this invention become apparent based on the following description of preferred embodiments with reference to the attached figures.

FIG. 1a shows a schematic view of a first embodiment of the semiconductor laser device as claimed in the invention;

FIG. 1b shows a view according to arrow Ib in FIG. 1a;

FIG. 2a shows a schematic view of a second embodiment of a semiconductor laser device as claimed in the invention; and FIG. 2b shows a view according to arrow IIb in FIG. 2a.

DETAILED DESCRIPTION OF THE INVENTION

FIGS. 1a and 1b show a first embodiment of a semiconductor laser device, as described in the invention, which has a semiconductor laser element 1, a lens means 2 which is made especially as a fast axis collimation lens, and at least one reflection means 3 which is made as a concave mirror. The reflecting concave surface 4 which faces the semiconductor laser element 1 together with the exit surface 5 of the semiconductor laser element 1 forms an external resonator.

The semiconductor laser element 1 is made especially as a semiconductor laser diode and especially as a broad strip emitter array. In a broad strip emitter on the side which is the right one in FIGS. 1a and 1b there is an emission surface which in the X-direction, see FIG. 1a, has an extension of for example 100 microns and in the Y direction, see FIG. 1b, an extension of for example 1 micron. Accordingly the X direction in this broad strip emitter is called the slow axis and the Y direction is called the fast axis. Especially when individual transverse modes are examined, this broad strip emitter in the fast axis and thus in the Y direction has much greater divergence than in the slow axis and thus in the X direction. FIGS. 1a and 1b do not show these size relationships realistically, but modified for the sake of illustration.

There is furthermore the possibility that the semiconductor laser element 1 is made as a laser diode bar in which several of the aforementioned broad strip emitters are arranged spaced in the X direction and flush with one another. There is furthermore the possibility that the semiconductor laser element 1 is made as a stack of these laser diode bars in which several of these laser diode bars are arranged on top of one another in the Y-direction.

Furthermore, as described in the invention, it is possible for the most part to coat for reflection the exit surface 5 for the laser radiation of the semiconductor laser element 1.

As is apparent from FIGS. 1a and 1b, the lens means 2 can be made as a cylinder lens with a cylinder axis which extends along the X-direction so that the lens means 2 can reduce the divergence of the laser radiation emerging from the semiconductor laser element in the direction of the fast axis or can also completely collimate it. This is shown schematically in FIG. 1b.

The lens means 2 can be made for example as a planoconvex cylinder lens. In particular, the cylinder surface can be made as a noncircular cylindrical surface. The lens means 2 preferably has a large aperture so that only few imaging errors occur. For example, the refractive index can be selected to be very high, for example between 1.7 and 1.9. In particular, the refractive index can be n=1.82. The focal length can be selected to be especially very small, for example a focal length f=1 mm can be selected.

Of the laser light emerging from the semiconductor laser element 1, for example only in FIG. 1a and FIG. 1b that portion in the form of component beams 6, 7 is imaged; the comparatively strong mode of the laser light which is selected by way of example is omitted. Generally, in the aforementioned semiconductor laser elements 1 which are made as broad strip emitters the strongest transverse modes propagate at an angle α of a few degrees, for example of α=7°, to the normal 8 on the exit surface 5. The direction of the normal 8 corresponds to the Z direction in FIGS. 1a and 1b. The portion of the laser light which corresponds to the mode which has been selected by way of example and which emerges at an angle α to the normal 8 from the exit surface 5 is split into two component beams 6,7, of which the first component beam 6 propagates at a positive angle α to the Z direction and the second component beam 7 at a negative angle α to the Z direction and to the normal 8. The component beam 6 in FIG. 1a thus runs obliquely to the top and to the right and is incident on the reflecting concave surface 4 of the reflection means 3. The component beam 7 in FIG. 1a runs to the right and downward and can emerge in one embodiment of this invention unhindered from the semiconductor laser device.

In another embodiment, of this invention it is possible to provide a second reflection means 9 with a reflecting concave surface 10 facing the exit surface 5 at the same distance at which the reflection means 3 is located from the exit surface 5. This reflection means 9 can be optionally partially mirrored so that part of the laser light can pass through the reflection means 9. Downstream of the reflection means, there can be a collimation lens 11. It is quite possible to combine the reflection means 9 and the collimation lens 11 in one component. The reflection means 9 and the collimation lens 11 are shown by the broken line in FIG. 1a (but not in FIG. 1b).

It is possible to choose the curvature of the reflection means 3 and optionally also the curvature of the reflection means 10 such that the component beams 6, 7 are transferred essentially back into themselves so that they are incident on the exit surface 5. To do this the optical distance D between the reflecting surface 4 of the reflection means 3 and the reflecting surface 10 of the reflection means 9 and the exit surface 5 in the direction of the component beam 6 and in the direction of the component beam 7 can be chosen such that the focal length F of a hollow mirror which is formed by the concave reflecting surface 4 and by the surface 10 corresponds to the optical distance D so that essentially F=D. When the reflecting surface 4 is made as a spherical surface thus there can be F=R/2=D. For a different curvature of the reflecting surface 4 in the fast axis and the slow axis direction the optical distance D can be determined according to the aforementioned formula using the radius in the slow axis direction.

Furthermore, suitable selection of the distance D and of the focal length of the reflection means 3 can result in that the beam waist of the component beams 6, 7 which belong to the individual transverse modes on the exit surface 5 of the component beams 6, 7 which have been reflected back by the reflection means 3 and/or the reflection means 9 onto the exit surface 5 corresponds essentially to the size of the exit surface 5 of the semiconductor laser element 1 which is made as a broad strip emitter. The exit surface 5 is thus used as an aperture through which the component beams 6, 7 which have been reflected back can enter or can be coupled into the semiconductor laser element 1.

As stated above, it is possible to make the reflection means 3, 9 as a spherical concave mirror. For this execution of the reflection means 3, 9, the lens means 2 which is used as a fast axis collimation lens should be dimensioned such that the divergence of the component beams 6, 7 corresponding to one transverse mode proceeding from the exit surface 5 after passing through the lens means 2 in the Y direction has a divergence which corresponds essentially to the divergence in the X direction so that for example in the area of the reflection means 3, 9 comparatively similar beam divergences and beam cross sections of the component beams 6, 7 occur in the direction of the slow axis and in the direction of the fast axis and moreover roughly in the X direction and in the Y direction. Such an embodiment is shown schematically in FIG. 1a and FIG. 1b.

If a lens means 2 is used which is made differently, and especially almost completely or completely collimates the component beams 6, 7, concave cylinder mirrors can be used as the reflection means 3, 9, and they have a distinct curvature with the cylinder axes in the Y direction and do not have any curvature or a much less distinct curvature with the cylinder axis in a direction which is perpendicular thereto. This embodiment is not shown in FIG. 1a and FIG. 1b.

Due to the back reflections of the individual component beams 6, 7 which are described in conjunction with the embodiments as shown in FIGS. 1a and 1b and which are portions of a certain selected mode, it is exactly the light of this selected transverse mode that is coupled back into the semiconductor laser element 1 so that this selected transverse mode is more or less well selected, i.e. that the semiconductor laser element 1 emits essentially only this mode. Without the external resonator as claimed in the invention, from the reflection means 3 and optionally the reflection means 10 and the exit surface 5 a semiconductor laser element 1 which is made as a broad strip emitter emits laser light with an entire series of transverse modes and with an entire series of longitudinal modes. The above described feedback of a selected transverse mode into the semiconductor laser element 1 can more or less effectively result in that the emitted laser light comprises essentially only this one transverse mode. To achieve laser light consisting essentially of one wavelength and thus of one longitudinal mode, an additional wavelength-selective element 12 which is made for example as an Etalon can be placed in the external resonator. This wavelength-selective element 12, in FIG. 1a, but not in FIG. 1b, the broken line, is located between the reflection means 3 and the lens means 2. Alternatively it is possible to combine the wavelength-selective element 12 with the reflection means 3, especially to integrate it into the latter.

It is possible to make the reflection means 9, which is not shown for the sake of better illustration in FIG. 1b, partially reflective so that the reflection means 9 acts at the same time as a decoupler. Alternatively, the reflection means 9 can also have a comparatively totally reflecting surface 10. In this case the side of the exit surface 13 which is located on the side of the semiconductor laser element 1 which is facing away from the external resonator and which is parallel to the exit surface 5 can be made as a simply partially reflecting surface so that the exit surface 13 is used as a decoupler. FIG. 1a and FIG. 1b for the sake of illustration of this embodiment on the left side of the semiconductor laser element 1 show beams 14 which are intended to schematically indicate the laser light which emerges from the exit surface 13 in the negative Z direction.

As described in the invention, the semiconductor laser element 1 can be comparatively unstructured. In particular, there need not be any guide means which given preference to propagation of one certain laser mode.

Furthermore, it is possible to supply the semiconductor laser element 1 only in one partial area with current for producing electron-hole pairs, this partial area corresponding essentially to the three-dimensional distribution of the desired laser mode of the laser light within the semiconductor laser element 1, which mode is to be excited. Conversely, the other component areas of the semiconductor laser element 1 are not provided with electrodes so that in this area no current supply for producing electron-hole pairs takes place. This dedicated arrangement of electrodes can further optimize the selection of the desired laser modes.

In the embodiment shown in FIG. 2*a* and FIG. 2*b* the same parts are provided with the same reference numbers as in FIG. 1*a* and FIG. 1*b*. In contrast to the embodiment shown in FIG. 1*a* and FIG. 1*b*, in the embodiment shown in FIG. 2*a* and FIG. 2*b* there is a prism element 15 between the lens means 2 and the reflection means 3. Furthermore, in contrast to the embodiment as shown in FIG. 1*a* and FIG. 1*b*, the reflection means 3 is arranged rotationally symmetrically to the normal 8 and to the middle perpendicular on the exit surface 5. The prism element 15 is used to deflect the component beams 6, 7 emerging from the exit surface 5 at an angle of ±α to the normal 8 or to the optical axis formed by the normal 8. For this purpose the prism element 15 ha a hypotenuse surface 16 which extends in the X-Y plane. This hypotenuse surface 16 is located on the side of the prism element 15 which faces the reflection means 3. On the side of the prism element 15 facing the exit surface 5 and the lens means 2 there are two leg surfaces 17 which include one angle β at a time with the hypotenuse surface 16 which is chosen according to the angle α. For example β can be roughly twice as large as α. The leg surfaces 17 include not only an angle β with the hypotenuse surface 16, but also with the X-Y plane so that the component beams 6, 7 are refracted on the leg surfaces 17 and following them on the hypotenuse surface 16, not shown in the schematic FIG. 2*a* and FIG. 2*b*.

The curvature of the reflecting surface 4 of the reflection means 3 can be chosen such that the component beams 6, 7 which emerge at the same angle α to the top and to the bottom and in the positive Z direction from the exit surface 5 they are transferred roughly into one another by the reflecting surface 4. FIG. 2*a* shows this by three selected component beams 6 which pass into three component beams 7 on the reflecting surface 4.

In the embodiment shown in FIGS. 2*a* and 2*b*, the optical distance D between the reflecting surface 4 and the exit surface 5 can be chosen such that D=R/2=F of the reflecting surface 4. Furthermore, by suitable selection of the distance D and the focal length of the reflection means 3 likewise the beam waist of the component beams 6, 7 which are reflected back by the reflecting surface 4 on the exit surface 5 can be chosen as claimed in the invention such that it corresponds roughly to the aperture which is given by the exit surface 5.

In the embodiment as shown in FIG. 1*a* and FIG. 1*b*, the selection of individual modes can take place by the reflection means 3 or the reflection means 3, 9 being turned such that the component beams which emerge from the exit surface 5 and which are incident on the reflection means 3, 9 are transferred back into one another. By rotating the reflecting surfaces 4, 10 thus a selection is made between modes which include a different angle α with the normal 8.

The mode selection in the embodiment as shown in FIG. 2*a* and FIG. 2*b* can be attained by changing the angle β of the prism element 15 and by shifting the prism element 15 along the Z direction. Depending on the size of the angle β, modes which include a corresponding angle α with the normal 8 and thus with the Z direction are selected, with component beams which emerge from the exit surface to the top and to the bottom and in the positive Z direction and which are essentially exactly superimposed on one another by the prism element 15 in the area of the reflecting surface 4.

As in the invention, in the embodiment as shown in FIG. 2*a* and FIG. 2*b* two decoupling possibilities are conceivable. On the one hand, the reflection means 3 can be made as an only partially reflecting reflection means. In this way part of the laser light can pass through the reflection means 3 to the right in FIG. 2*a* and thus in the Z direction. Alternatively, the reflection means 3 can be made as an essentially totally reflecting reflection means, conversely then the exit surface 13 of the semiconductor laser element 1 which is the left one in FIG. 2*a* is made partially reflecting so that in the negative Z-direction laser light according to the illustrated beams 14 can emerge. In both cases the exit surface 5 of the semiconductor laser element 1 which is the right one in FIG. 2*a* should be comparatively well coated with an antireflective coating so that the feedback of the component beams 6, 7 into the semiconductor laser element 1 will take place as effectively as possible and at the same time the feedback of the internal resonator is reduced.

A wavelength-selective element 12 can also be placed in the external resonator as shown in FIG. 2*a* and FIG. 2*b*.

What is claimed is:

1. A semiconductor laser device comprising:
   a semiconductor laser element with at least one exit surface from which laser light can emerge, which in a first direction (Y) has greater divergence than in a second direction which is perpendicular to it;
   the semiconductor laser device comprises two reflection means with two reflecting surfaces, the two reflecting surfaces each being tilted at oppositely equal angles (∝) to the normal on the exit surface, with a reflecting surface which can reflect back at least parts of the light which has emerged from the semiconductor laser element through the exit surface into the semiconductor laser element such that a mode spectrum of the semiconductor laser element is influenced thereby;
   and a lens means which is located between the two reflection means and the semiconductor laser element and which can at least partially reduce the divergence of the laser light at least in the first direction (Y), wherein
   the two reflecting surfaces of the two reflection means are concavely curved.

2. The semiconductor laser device as claimed in claim 1, wherein a reflecting surface in the first direction (Y) and in the second direction which is perpendicular to it has a curvature of essentially the same size or curvatures of differing magnitude.

3. The semiconductor laser device as claimed in claim 1, wherein an optical distance (D) between the two reflecting surfaces and the exit surface of the semiconductor laser element is essentially equal to the focal length (F) of the reflecting surface with respect to at least one of the directions (Y).

4. The semiconductor laser device as claimed in claim 1, wherein the exit surface of the semiconductor laser element facing the reflection means has a width of more than 200 microns and the two reflecting surfaces are not curved or are curved only insignificantly.

5. The semiconductor laser device as claimed in claim 4, wherein the exit surface has a width of more than 500 microns, or more than 1 mm.

6. The semiconductor laser device as claimed in claim 4, wherein at least one of the two reflecting surfaces is made as a wavelength-sensitive element, or as a grating.

7. The semiconductor laser device as claimed in claim 1, wherein the optical distance (D) and/or the curvature of the two reflecting surfaces are chosen such that the beam waist on the exit surface of at least component beams of the light which has been reflected back to the semiconductor laser element corresponds essentially to an aperture which is formed by the exit surface.

8. The semiconductor laser device as claimed in claim 1, wherein the semiconductor laser element is a broad strip emitter or a bar or stack of broad strip emitters.

9. The semiconductor laser device as claimed in claim 1, wherein the exit surface of the semiconductor laser element facing the two reflecting surfaces is coated with an antireflective coating.

10. The semiconductor laser device as claimed in claim 1, wherein the two reflecting surfaces of the two reflection means have a same optical distance (D) to the exit surface of the semiconductor laser element.

11. The semiconductor laser device as claimed in claim 1, wherein at least one of the two reflecting surfaces of the two reflection means is made as a partially reflecting surface so that at least one reflection means which is provided with a partially reflecting surface is used as a decoupler.

12. The semiconductor laser device as claimed in claim 1, wherein the two reflecting surfaces of the reflection means are made highly reflecting, the exit surface of the semiconductor laser element facing away from the reflecting surfaces being made partially reflecting and being used as a decoupler in this way.

13. The semiconductor laser device as claimed in claim 1, wherein between the semiconductor laser element and the two reflection means there is a deflection means which can deflect onto the two reflection means the component beams which are emerging at an angle ($\alpha$) to the normal on the exit surface from the latter.

14. The semiconductor laser device as claimed in claim 13, wherein the deflection means and the two reflection means are located on an axis which is dictated by a middle perpendicular on the exit surface.

15. The semiconductor laser device as claimed in claim 13, wherein the deflection means is as a prism element.

16. The semiconductor laser device as claimed in claim 15, wherein the prism element is arranged such that the leg surfaces are facing the exit surface of the semiconductor element.

17. The semiconductor laser device as claimed in claim 16, wherein by the suitable choice of the angle ($\beta$) between a hypotenuse surface and the leg surfaces of the prism element and/or by the suitable choice of the position of the prism element between the exit surface and the reflecting surface component beams which emerge at an angle ($\pm\alpha$) relative to the normal on the exit surface from the latter can be transferred into one another by the reflecting surface of the at least one reflection means.

18. The semiconductor laser device as claimed in claim 13, wherein the two reflecting surfaces of the two reflection means is made partially reflective so that the at least one reflection means can be used as a decoupler.

19. The semiconductor laser device as claimed in claim 13, wherein the two reflecting surfaces of the two reflection means is made highly reflecting, the exit surface of the semiconductor laser element facing away from the reflecting surface being made partially reflecting and in this way being able to be used as a decoupler.

20. The semiconductor laser device as claimed in claim 1, wherein between the semiconductor laser element and the two reflection means there is a wavelength-selective element which is an etalon.

21. The semiconductor laser device as claimed in claim 1, wherein the lens means is made as a cylinder lens with a cylinder axis which extends essentially in the second direction which is perpendicular to the first direction (Y), or is made such that the laser light which has emerged from the exit surface of the passing through the lens means in the first direction (Y) has a divergence roughly the same magnitude as in the second direction which is perpendicular thereto.

22. The semiconductor laser device as claimed in claim 1, wherein the semiconductor laser element is exposed to a voltage and is supplied with a current for producing electron-hole pairs only in partial areas which correspond to a three-dimensional extension of the desired mode of the laser light.

23. The semiconductor laser device as claimed in claim 1, wherein the reflecting surface is spherically curved.

* * * * *